(12) United States Patent
Kishi et al.

(10) Patent No.: US 10,037,960 B2
(45) Date of Patent: Jul. 31, 2018

(54) CONNECTION STRUCTURE AND CONNECTING METHOD OF CIRCUIT MEMBER

(71) Applicant: Panasonic Intellectual Property Management Co., Ltd., Osaka (JP)

(72) Inventors: Arata Kishi, Fukuoka (JP); Hiroki Maruo, Fukuoka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/582,801

(22) Filed: May 1, 2017

(65) Prior Publication Data

US 2017/0345782 A1    Nov. 30, 2017

(30) Foreign Application Priority Data

May 30, 2016    (JP) .................................. 2016-107854

(51) Int. Cl.
*H01L 23/00*    (2006.01)
*B23K 1/00*    (2006.01)
(Continued)

(52) U.S. Cl.
CPC ............ *H01L 24/13* (2013.01); *B23K 1/0016* (2013.01); *B23K 35/264* (2013.01); *C22C 12/00* (2013.01); *C22C 28/00* (2013.01); *H01L 24/05* (2013.01); *H01L 24/11* (2013.01); *H01L 24/29* (2013.01); *H01L 24/73* (2013.01); *H01L 24/81* (2013.01); *H01L 24/92* (2013.01); *H05K 1/111* (2013.01); *H05K 1/181* (2013.01); *H05K 3/3457* (2013.01); *H01L 2224/05609* (2013.01); *H01L 2224/05611* (2013.01); *H01L 2224/05686* (2013.01); *H01L 2224/13109* (2013.01); *H01L 2224/13113* (2013.01); *H01L 2224/16227* (2013.01); *H01L 2224/2919* (2013.01); *H01L 2224/73204* (2013.01); *H01L 2224/81203* (2013.01);
(Continued)

(58) Field of Classification Search
CPC ......... H01L 24/12; H01L 24/14; H05K 1/111; H05K 3/34; H05K 3/345; H05K 3/363; C22C 12/00
See application file for complete search history.

(56) References Cited

U.S. PATENT DOCUMENTS

2014/0110153 A1* 4/2014 Kashiwagi ............ B22F 1/0074
                                                               174/251
2014/0318837 A1* 10/2014 Eifuku .................. H05K 3/361
                                                               174/257

FOREIGN PATENT DOCUMENTS

JP            2014-130956 A       7/2014

* cited by examiner

*Primary Examiner* — Timothy Thompson
*Assistant Examiner* — Amol Patel
(74) *Attorney, Agent, or Firm* — Pearne & Gordon LLP

(57) ABSTRACT

There is provided a connection structure of a circuit member including: a first circuit member having a first main surface provided with a first electrode; a second circuit member having a second main surface provided with a second electrode; and a joining portion which is interposed between the first main surface and the second main surface, in which the joining portion has a solder portion which electrically connects the first electrode and the second electrode to each other, in which the solder portion contains a bismuth-indium alloy, and in which an amount of bismuth contained in the bismuth-indium alloy exceeds 20% by mass and is equal to or less than 80% by mass.

14 Claims, 2 Drawing Sheets

(51) Int. Cl.
*C22C 28/00* (2006.01)
*H05K 1/18* (2006.01)
*B23K 35/26* (2006.01)
*C22C 12/00* (2006.01)
*H05K 3/34* (2006.01)
*H05K 1/11* (2006.01)

(52) U.S. Cl.
CPC ............... *H01L 2224/9202* (2013.01); *H01L 2224/92125* (2013.01); *H01L 2924/014* (2013.01); *H01L 2924/0543* (2013.01); *H01L 2924/0544* (2013.01); *H01L 2924/0549* (2013.01)

US 10,037,960 B2

CONNECTION STRUCTURE AND CONNECTING METHOD OF CIRCUIT MEMBER

BACKGROUND

1. Technical Field

The disclosure relates to a connection structure and a connecting method of a circuit member.

2. Description of the Related Art

In a method of connecting the first circuit member having a first main surface provided with a first electrode and a second circuit member having a second main surface provided with a second electrode having a bump via solder material, first, the first circuit member and the second circuit member are disposed such that the first electrode and the second electrode oppose each other. Next, after melting a solder material by heating the second circuit member while pressing the second circuit member to the first circuit member, by stopping the heating and by solidifying the melted solder material, a solder portion which electrically connects the first electrode and the second electrode to each other is formed.

In the connecting method, the bump is configured of a solder material (Japanese Patent Unexamined Publication No. 2014-130956), or a coating layer containing the solder material is formed on a front surface of the first electrode.

SUMMARY

The disclosure relates to a connection structure of a circuit member including a first circuit member having a first main surface provided with a first electrode; a second circuit member having a second main surface provided with a second electrode; and a joining portion which is interposed between the first main surface and the second main surface, in which the joining portion has a solder portion which electrically connects the first electrode and the second electrode to each other, in which the solder portion contains a bismuth-indium alloy, and in which an amount of bismuth contained in the bismuth-indium alloy exceeds 20% by mass and is equal to or less than 80% by mass in the bismuth-indium alloy.

In addition, the disclosure relates to a connecting method of a circuit member for connecting a first circuit member having a first main surface provided with a first electrode and a second circuit member having a second main surface provided with a second electrode, the method including: a disposing process of disposing the first circuit member and the second circuit member so as to cause the first electrode and the second electrode to oppose each other via a solder material containing a bismuth-indium alloy; and a solder portion forming process of forming a solder portion which electrically connects the first electrode and the second electrode to each other by heating the second circuit member while pressing the second circuit member to the first circuit member, melting the solder material, and solidifying the melted solder material, in which an amount of bismuth contained in the bismuth-indium alloy exceeds 20% by mass and is equal to or less than 80% by mass.

According to the connection structure of a circuit member according to the disclosure, it is possible to improve reliability of electric connection between the first electrode of the first circuit member and the second electrode of the second circuit member.

DETAILED DESCRIPTION

Figure 1A:
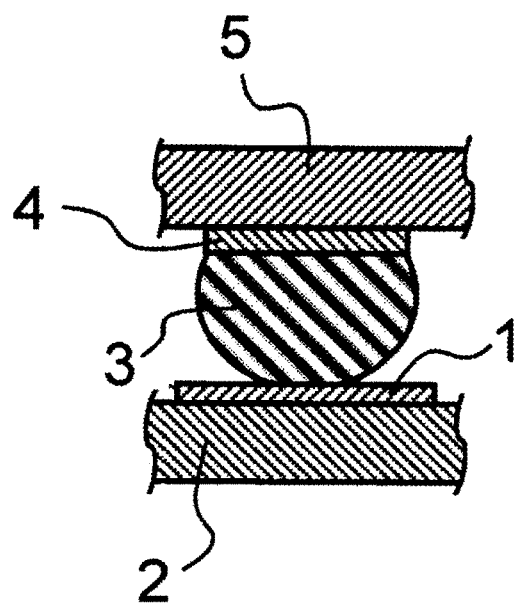
FIG. 1A is a schematic sectional view illustrating an example of main portions in a state where a second circuit member is placed on the first circuit member in a connecting method of a circuit member according to an embodiment.

Before the description of an embodiment, a problem in the technology of the related art will be briefly described.

In general, since an electrode (in particular, an electrode containing a metal oxide, such as a transparent electrode) which is formed by evaporation or the like and of which a front surface is relatively coarse is unlikely to become wet by a melted solder material, it is difficult to an excellent connection state. Accordingly, with respect to such an electrode, a solder material which can form a solder portion that firmly adheres to the electrode sufficiently following the front surface of the electrode during the melting, is required.

Connecting Method of Circuit Member

First, a connecting method of a circuit member for connecting a first circuit member having a first main surface provided with a first electrode and a second circuit member having a second main surface provided with a second electrode having a bump, will be described. The solder material is given to or coats the front surface of the first electrode, or is included at least in a tip end portion of the bump.

Disposing Process (i) and Solder Portion Forming Process (ii)

The connecting method of a circuit member includes (i) a disposing process of disposing the first circuit member and the second circuit member so as to cause the first electrode and the second electrode to oppose each other via the solder material; and (ii) a solder portion forming process of forming a solder portion which electrically connects the first electrode and the second electrode to each other by solidifying the melted solder material after melting the solder material by heating the second circuit member while pressing the second circuit member to the first circuit member.

The solder material which is used in the connecting method contains a bismuth-indium alloy. Since bismuth contained in the solder material is abnormal liquid of which a volume expands when being solidified from the melted state, in the solder portion forming process (ii), in a process of solidifying the melted solder material, the solder material expands and a pressure increases on an interface between the solder material and the first electrode and the second electrode. Accordingly, the solder material is likely to follow the front surface of the electrode, and the solder portion formed by solidifying the solder material can firmly adhere to the first electrode and the second electrode.

Meanwhile, since indium contained in the solder material is excellent in malleability, it is possible to increase a wet area between the solder material and the first electrode and the second electrode.

In order to obtain a sufficient effect and an excellent balance by the bismuth and indium, it is necessary that the amount of bismuth contained in the bismuth-indium alloy exceeds 20% by mass and is equal to or less than 80% by mass. When the amount of bismuth contained in the bismuth-indium alloy exceeds 20% by mass, an effect by the bismuth is sufficiently achieved, and the solder portion and the electrode (in particular, a transparent electrode) are allowed to firmly adhere to each other and can be joined to each other. When the amount of bismuth contained in the bismuth-indium alloy is equal to or less than 80% by mass, the effect by the indium is sufficiently obtained. When the amount of bismuth contained in the bismuth-indium alloy exceeds 80% by mass, the melting point of the solder material increases, and there is a case where a defect, such as a curve of a circuit member, is generated as a heating temperature which is necessary for the connection between the electrodes increases.

From the viewpoint of improving joining properties between the electrodes by abnormal liquid of the bismuth, the amount of bismuth contained in the bismuth-indium alloy is preferably from 25% by mass to 80% by mass, is more preferably from 40% by mass to 80% by mass, and is still more preferably from 55% by mass to 80% by mass.

Figure 1B:
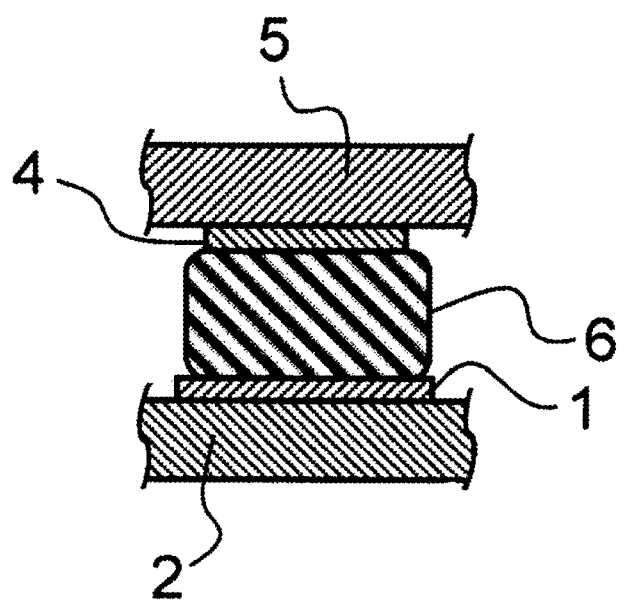
FIG. 1B is a schematic sectional view illustrating an example of a solder portion formed by solidifying a solder material in the connecting method of a circuit member according to the embodiment.

Here, as illustrated in FIGS. 1A and 1B, main portions of a connection state of the circuit member in the solder portion forming process (ii) are schematically illustrated. FIG. 1A illustrates the main portions in a state where the second circuit member is placed on the first circuit member. FIG. 1B illustrates the main portions in a state where the first electrode and the second electrode are connected via the solder portion formed by solidifying the solder material.

In the disposing process (i), second circuit member 5 having second electrode 4 is placed on first circuit member 2 having first electrode 1. Second electrode 4 includes a solder bump configured of solder material 3 on the front surface thereof. Solder material 3 contains the bismuth-indium alloy of which a content of bismuth exceeds 20% by mass and is equal to or less than 80% by mass. According to this, first circuit member 2 and second circuit member 5 are disposed such that first electrode 1 and second electrode 4 oppose each other via solder material 3 (solder bump).

Next, in the solder portion forming process (ii), after heating second circuit member 5 while pressing second circuit member 5 to first circuit member 2 and melting solder material 3, the heating is stopped and melted solder material 3 is solidified. In the process of stopping the heating and solidifying solder material 3 from the melted state, solder material 3 expands since bismuth is contained and sufficiently follows the front surface of the first electrode. In addition, since melted solder material 3 contains indium, solder material 3 appropriately wet-spreads to first electrode 1 and second electrode 4. As a result, as illustrated in FIG. 1B, a volume of solder material 3 expands from the state of FIG. 1A, and solder portion 6 formed by solidifying solder material 3 is firmly connected to first electrode 1 and second electrode 4. In FIG. 1B, solder portion 6 is interposed between the first main surface of first circuit member 2 and second main surface of second circuit member 5, and a joining portion according to the disclosure is formed.

The solder material containing the bismuth-indium alloy is efficient in connecting the electrode (in particular, an electrode containing a metal oxide, such as a transparent electrode) which is formed by evaporation or the like and of which the front surface is relatively coarse. In general, since electrode is unlikely to become wet by the melted solder material, it is difficult to achieve excellent connection state. In addition, there is a case where the electrode containing the metal oxide reacts to the solder at a high temperature and is partially lost. Meanwhile, since the solder material containing the bismuth-indium alloy can also sufficiently follow the front surface of the electrode and can wet-spread, it is possible to achieve an excellent connection state. In addition, since the solder material containing the bismuth-indium alloy is melted at a low temperature, the electrode containing the metal oxide is rarely damaged.

In the transparent electrode, an arithmetic average roughness Ra is preferably from 5 nm to 10 nm, and a maximum height Rz is preferably equal to or less than 70 nm. In a case of using a transparent electrode which is formed by evaporation or the like and of which the front surface of the above-described range is relatively coarse, it is also possible to achieve an excellent connection state by using the bismuth-indium alloy. In addition, the arithmetic average roughness Ra and the maximum height Rz are acquired by a measuring method based on JIS B 0601-2001.

In order to perform the heating of the solder portion forming process (ii) at a low temperature (for example, equal to or lower than 130° C.), the amount of bismuth contained in the bismuth-indium alloy is preferably from 27% by mass to 68% by mass. In a case where the amount of bismuth contained in the bismuth-indium alloy is from 27% by mass to 68% by mass, the melting point of the bismuth-indium alloy is from 72° C. to 109° C. Since the heating of the solder portion forming process (ii) can be performed at a low temperature, it is possible to reduce a thermal stress applied to the circuit member, and in a case of connecting a circuit member which is weak to the thermal stress, such as a glass board, it is also possible to sufficiently suppress generation of a defect, such as a curve of the circuit member.

In order to perform the heating of the solder portion forming process (ii) at a low temperature (for example, equal to or lower than 110° C.), the amount of bismuth contained in the bismuth-indium alloy is more preferably from 27% by mass to 55% by mass. In this case, the melting point of the bismuth-indium alloy is equal to 100° C. or lower than 100° C.

In order to further perform the heating of the solder portion forming process (ii) at a low temperature (for example, equal to or lower than 100° C.), the amount of bismuth contained in the bismuth-indium alloy is still more preferably from 35% by mass to 55% by mass. In this case, the melting point of the bismuth-indium alloy is equal to 90° C. or lower than 90° C.

Examples of the bismuth-indium alloy of which the melting point is 72° C. to 109° C. include 35Bi-65In (melting point: 72° C.), 51Bi-49In (melting point: 85° C.), 55Bi-45In (melting point: 89° C.), 27Bi-73In (melting point: 100° C.), and 68Bi-32In (melting point: 109° C.). However, XBi-YIn means an alloy containing X % by mass of bismuth and Y % by mass of indium.

Most (for example, 99% by mass or more of a remaining part) of the remaining part of the bismuth-indium alloy other than bismuth is preferably indium. The bismuth-indium alloy has high connection reliability between the electrodes, and a low melting point. Examples of the bismuth-indium alloy also contain at least one type selected from a group made of $BiIn_2$, $Bi_3In_5$, and BiIn.

The bismuth-indium alloy may slightly contain a third component in addition to bismuth and indium. The amount of the third component contained in the bismuth-indium alloy is, for example, equal to or less than 0.01% by mass. Examples of the third component include nickel or cobalt. As the third component exists, for example, it is possible to improve a mechanical strength of the solder portion formed by solidifying the solder material.

In addition, from viewpoint of improving wettability of the solder material to the electrode and reliability of electric connection between the electrodes, in the bismuth-indium alloy contained in the solder material, the amount of indium contained in the bismuth-indium alloy is preferably equal to or greater than 20% by mass and less than 80% by mass, is more preferably from 20% by mass to 75% by mass, is still more preferably from 20% by mass to 60% by mass, and is particularly preferably from 20% by mass to 45% by mass.

In order to improve wettability of the solder material to the electrode, the front surface of the solder material may be coated with a flux. A known material may be used as the flux. However, in a case of using the solder material containing the bismuth-indium alloy, it is possible to firmly connect the electrodes without using a flux, and to improve reliability of the electric connection between the first electrode and the second electrode. In other words, in the disposing process (i), the flux may not be interposed between the first electrode and the solder material. In this case, a process of coating the front surface with the flux and a process of removing a residue of the flux after forming the solder portion are not necessary, and it is possible to reduce the number of processes.

In order to perform the connection between the electrodes via the solder material, a pressure applied to the circuit member may be low. Accordingly, in a case of connecting a thin circuit member having a low strength, a defect is unlikely to be generated, and it is possible to ensure high reliability of the electric connection between the first electrode and the second electrode.

First Circuit Member

The first circuit member includes, for example, the first main surface provided with a plurality of first electrodes that are arranged at a predetermined pitch. The first circuit member is not particularly limited, but may be a transparent board used in a display panel provided in a television, a tablet, a smartphone, and a wearable device. The transparent board may be semitransparent. Examples of the transparent board include a glass board and a film-like board. The film-like board is formed of a transparent resin film. The transparent resin film may be a film, such as polyethylene terephthalate (PET), polycarbonate (PC), or polyethylene naphthalate (PEN). The first main surface may be an any main surface of the first circuit member.

In a case where the first circuit member is a transparent board, a transparent electrode is used as the first electrode. The transparent electrode may be an oxide containing indium and tin, and may contain a fine amount of third metal element in addition to indium and tin. A representative example of the transparent electrode is a so-called indium tin oxide or indium tin oxide (ITO) electrode.

The first electrode may be a pad electrode. In a case where the solder material is provided in a front surface of the pad electrode, the solder material may exist at a part at which the bump lands at least when pressing the front surface of the pad electrode. The coating layer containing the solder material may be formed on the front surface of the pad electrode. As a method for giving the solder material to the front surface of the first electrode, a known method may be used.

Second Circuit Member

The second circuit member includes, for example, the second main surface provided with a plurality of second electrodes that, are arranged at a predetermined pitch. The second circuit member is not particularly limited, but for example, may be a semiconductor chip, an electronic component package, a film board, and a connector. The second main surface may be an any main surface of the second circuit member.

The second electrode is not particularly limited, but for example, may be a metal electrode containing gold, platinum, copper, nickel, palladium, or various solders. The solder which forms the metal electrode may include, for example, tin, silver, bismuth, indium, nickel, or copper.

Bump

A bump which exists on the front surface of the second electrode is provided for reliably connecting the first electrode and the second electrode by a short distance. A mounting area in the electric connection between the electrodes which use the bump can be smaller compared to wire bonding, and is advantageous in reducing the size of the electronic component. In addition, since it is possible to reduce a connection distance between the electrodes, the electric connection is advantageous for the connection of electronic components that require excellent electric properties.

In a case where the bump is configured of a solder material, at least a tip end portion of the bump may contain the solder material. The tip end portion of the bump is a part at which the first electrode lands during the pressing. The entire bump may be configured of the solder material. In addition, in a case where the bump includes a part configured of a metal material other than the solder material, the part may also be used as a part of the second electrode. As a method of forming the bump using a solder material, a known method may be used.

From the viewpoint of sufficiently obtaining an expansion effect of the solder material by the abnormal liquid of bismuth, the maximum diameter of the bump is preferably equal to or greater than 20 µm.

Among the bumps, a bump of which a volume ratio that takes a part configured of the solder material is equal to or greater than 30% by mass is preferable. Accordingly, the expansion effect of the solder material by the abnormal liquid of bismuth is sufficiently obtained.

In the solder portion forming process (ii), when pressing the second circuit member to the first circuit member, the first circuit member is also pressed to the second circuit member. In other words, a tool for pressing any of the circuit members may be pressed. The heating of the solder material is performed by heating the first circuit member and/or the second circuit member, for example, by using the tool for heating. The tool for pressing may also be used as a tool for heating.

Adhesive Interposing Process (iii) and Resin Portion Forming Process (iv)

Furthermore, the above-described connecting method including (iii) an adhesive interposing process of interposing an adhesive between the first main surface and the second main surface, and (iv) a resin portion forming process of forming a resin portion from the adhesive, the resin portion causing the first main surface and the second main surface to adhere to each other is preferable. Accordingly, the connection strength of the circuit members is improved.

The resin portion preferably covers at least a part of the solder portion. Accordingly, the solder portion is reinforced and the strength of the connection structure is further improved. In addition, in a case where the circuit member includes the plurality of electrodes that are arranged at a predetermined pitch, even in a case where the pitch between the electrodes is narrow, insulation between the adjacent electrodes is likely to be ensured. For example, it is desirable that the resin portion is formed such that a void of the plurality of solder portions which connect the plurality of first electrodes and the plurality of second electrodes is embedded.

The adhesive interposing process (iii) may be performed after the solder portion forming process (ii). In a case where the adhesive interposing process (iii) is performed after the solder portion forming process (ii), for example, an adhesive (underfill material) may fill a part between the first main surface and the second main surface.

Otherwise, in the disposing process (i), the adhesive may be interposed between the first main surface and the second main surface. In the disposing process (i), in a case of interposing the adhesive between the first main surface and the second main surface, for example, the first main surface and the second main surface may be coated with the adhesive.

Adhesive

The adhesive may be a resin composition containing a thermosetting resin, such as an epoxy resin. The resin composition may further contain a hardener of the thermosetting resin. Examples of the hardener include amine, phenol resin, and acid anhydride. The resin composition may further contain various additives. Examples of the additive include an activator that removes acid anhydride of the solder material or a front surface of the electrode, a filler, and a hardening accelerator.

The resin portion contains a hardened material obtained by a hardening reaction of the thermosetting resin. A heating temperature of the solder portion forming process (ii) is preferably higher than the temperature at which the hardening reaction of the thermosetting resin proceeds. In the disposing process, in a case where the adhesive is interposed between the first main surface and the second main surface, it is possible to form the solder portion and to form the resin portion.

The temperature at which the hardening reaction of the thermosetting resin proceeds is preferably higher than the melting point of the solder material. Accordingly, most of the hardening reaction of the thermosetting resin proceeds after the solder material is melted and the first electrode and the second electrode are wet by the solder material. Accordingly, it is possible to improve reliability of the electric connection between the first electrode and the second electrode.

Connection Structure of Circuit Member

The connection structure of a circuit member according to the disclosure is obtained by the above-described connecting method. The connection structure includes the first circuit member having the first main surface provided with the first electrode; the second circuit member having the second main surface provided with the second electrode; and the joining portion which is interposed between the first main surface and the second main surface. The joining portion has a solder portion formed by the above-described connecting method. The joining portion may further include the resin portion formed by the above-described connecting method.

The solder portion contains the bismuth-indium alloy of which the content of bismuth exceeds 20% by mass and is equal to or less than 80% by mass at least in the vicinity of the first electrode. The vicinity of the first electrode indicates a part further on an inner side (solder portion side) than an alloy layer thereof in a case where the alloy layer is formed between the solder portion and the first electrode at the solder portion. The alloy layer includes metal contained in the first electrode and metal contained in the solder material.

In the above-described connecting method, in a case where the bump is configured of the solder material, the solder portion formed by solidifying the solder material contains the bismuth-indium alloy at least between the first electrode and the second electrode. In the above-described connecting method, in a case of forming the coating layer containing the solder material on the front surface of the first electrode, the solder portion formed by solidifying the solder material contains the bismuth-indium alloy at least between the first electrode and the bump.

EXAMPLE

Next, the disclosure will be more specifically described based on an example. However, the disclosure is not limited to the following example.

Making First Circuit Member

A plurality of ITO electrodes (thickness of 1500 Å) having a width of 50 μm are formed in stripes as a transparent electrode on one front surface (first main surface) of a rectangular (size of 30 mm×30 mm) glass board having a thickness of 0.3 mm. A pitch of the ITO electrode is 0.1 mm.

In addition, an evaporation method is used in forming the ITO electrode. Regarding the state of the front surface of the ITO electrode, the arithmetic average roughness Ra is 7.8 nm and the maximum height Rz is 66.6 nm. The arithmetic average roughness Ra and the maximum height Rz are acquired by a measuring method based on JIS B 0601-2001.

Making Plate-Like Member for Evaluation

In order to evaluate a connection state between the electrodes, instead of the second circuit member including the second main surface provided with the second electrode, for convenience, a Cu plate-like member of which a front surface is Au-plated (thickness of Au-plated layer is from 0.1 to 0.5 μm) and which has a shape of a rectangle (size of 3.2 mm×1.6 mm) having a thickness of 1.6 mm.

By an electrolytic plating method, instead of the bump, the coating layer (thickness of 3 to 10 μm) containing the solder material is formed on one front surface (size of 3.2 mm×1.6 mm) of the plate-like member.

Connection of Circuit Member

The plate-like member including the coating layer containing the solder material is placed on the glass board including a transparent electrode. In this manner, the glass board and the plate-like member are disposed such that the transparent electrode and the Au-plated layer oppose each other via the solder material (disposing process (i)).

The solder material is melted by heating the plate-like member on a hot plate below the glass board while pressing the plate-like member to the glass board, by using the weight of the plate-like member for evaluation itself. At this time, the melted solder material is heated for 10 seconds at a temperature which is approximately 10° C. higher than the melting point of the solder material. After this, by stopping the heating and by solidifying the melted solder material, the solder portion which connects the transparent electrode and the Au-plated layer to each other is formed (solder portion forming process (ii)). In this manner, the connection structure of a circuit member (connection structure body for evaluation) is obtained.

In making the above-described connection structure body for evaluation, as the solder material, In simple substance (melting point: approximately 156° C.), 10Bi-90In (melting point: 140° C.), 20Bi-80In (melting point: 110° C.), 40Bi- 60In (melting point: 80° C.), 55Bi-45In (melting point: 89° C.), 80Bi-20In (melting point: 180° C.), and Bi simple substance (melting point: approximately 271° C.), are used. In addition, XBi-Yin means an alloy containing X % by mass of bismuth and Y % by mass of indium.

Each of the connection structure bodies for evaluation is obtained by using various solder materials.

Evaluation

By using a bonding tester (manufactured by Rhesca Co., Ltd, PTR-1102), the connection strength between the transparent electrode and the Au-plated layer of the connection structure body for evaluation is measured. Specifically, after fixing the connection structure body for evaluation, a side surface (size of 1.6 mm×1.6 mm) of the plate-like member for evaluation is pressed by a tool to which a load sensor is attached, and a load when the connection between the transparent electrode and the Au-plated layer is destructed is measured. During the measurement, the tool is lowered to reach a height of 0.3 mm from a glass board surface. A sending speed of the tool is 0.5 mm/second.

Figure 2:
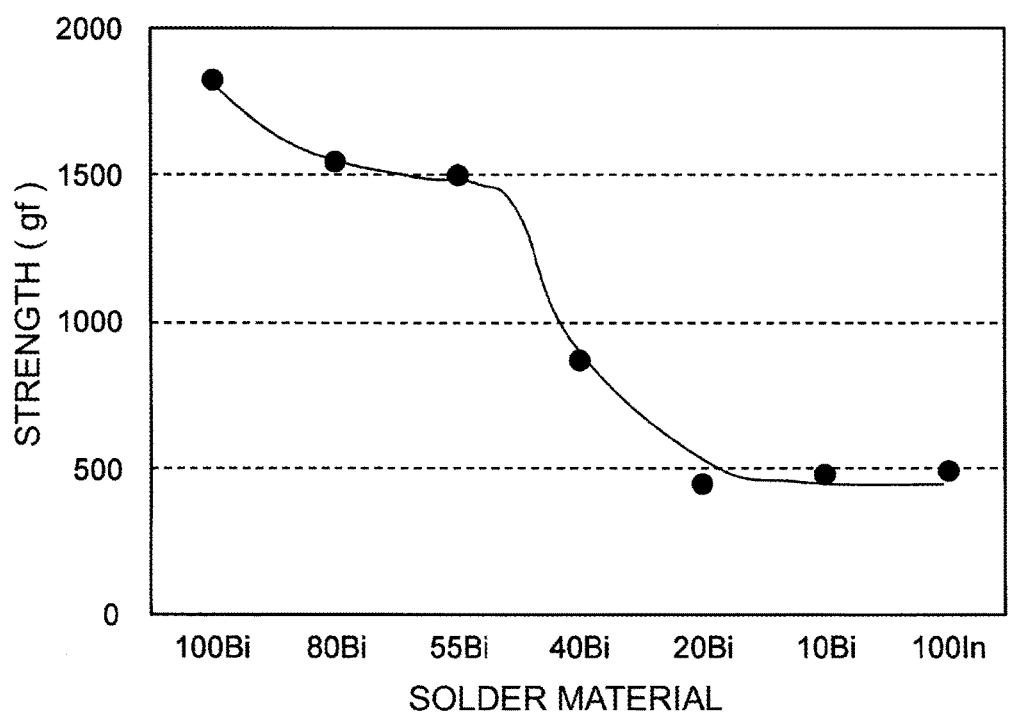
FIG. 2 is a view illustrating a relationship between a connection strength of a connection structure and an alloy composition of the solder material in an example and a comparative example according to embodiment.

The evaluation result is illustrated in FIG. 2. In addition, 100In, 10Bi, 20Bi, 40Bi, 55Bi, 80Bi, and 100Bi in FIG. 2 respectively indicate In simple substance (comparative example), 10Bi-90In (comparative example), 20Bi-80In (comparative example), 40Bi-60In, 55Bi-45In, 80Bi-20In, and Bi simple substance (comparative example).

In a case (example) where 40Bi-60In, 55Bi-45In, and 80Bi-20In are used as the solder material, a high connection strength is obtained.

In a case (comparative example) where 20Bi-80In, 10Bi-90In, and In simple substance are used as the solder material, the connection strength deteriorates. In a case (comparative example) where Bi simple substance is used as the solder material, the connection strength is high, but the melting point of the solder material is extremely high, and thus, it is not possible to connect the transparent electrode and the Au-plated layer at a low temperature.

The connection structure and the connecting method of a circuit member according to the disclosure are particularly efficient with respect to the circuit member provided with an electrode which is unlikely to become wet by the solder material similar to the glass board including the transparent electrode used in liquid crystal or the like.

What is claimed is:

1. A connection structure of a circuit member, comprising:
    a first circuit member having a first main surface provided with a first electrode;
    a second circuit member having a second main surface provided with a second electrode; and
    a joining portion which is interposed between the first main surface and the second main surface,
    wherein the joining portion has a solder portion which electrically connects the first electrode and the second electrode to each other,
    wherein the solder portion contains a bismuth-indium alloy,
    wherein an amount of bismuth contained in the bismuth-indium alloy exceeds 20% by mass and is equal to or less than 80% by mass, and
    wherein more than 99% by mass of the remaining part of the bismuth-indium alloy other than bismuth is indium.

2. The connection structure of a circuit member according to claim 1,
    wherein the joining portion further includes a resin portion which causes the first main surface and the second main surface to adhere to each other.

3. The connection structure of a circuit member according to claim 1,
    wherein the first electrode is a transparent electrode.

4. The connection structure of a circuit member according to claim 1,
    wherein an amount of bismuth contained in the bismuth-indium alloy is from 27% by mass to 68% by mass.

5. The connection structure of a circuit member according to claim 4,
    wherein a melting point of the bismuth-indium alloy is from 72° C. to 109° C.

6. The connecting method of a circuit member according to claim 1,
    wherein a melting point of the bismuth-indium alloy is from 72° C. to 109° C.

7. A connecting method of a circuit member for connecting a first circuit member having a first main surface provided with a first electrode and a second circuit member having a second main surface provided with a second electrode, the method comprising:
    a disposing process of disposing the first circuit member and the second circuit member so as to cause the first electrode and the second electrode to oppose each other via a solder material containing a bismuth-indium alloy; and
    a solder portion forming process of forming a solder portion which electrically connects the first electrode and the second electrode to each other by heating the second circuit member while pressing the second circuit member to the first circuit member, melting the solder material, and solidifying the melted solder material,
    wherein an amount of bismuth contained in the bismuth-indium alloy exceeds 20% by mass and is equal to or less than 80% by mass, and
    wherein more than 99% by mass of the remaining part of the bismuth-indium alloy other than bismuth is indium.

8. The connecting method of a circuit member according to claim 7, further comprising:
    an adhesive interposing process of interposing an adhesive between the first main surface and the second main surface; and
    a resin portion forming process of forming a resin portion from the adhesive, the resin portion causing the first main surface and the second main surface to adhere to each other.

9. The connecting method of a circuit member according to claim 8,
    wherein the adhesive interposing process is performed after the solder portion forming process.

10. The connecting method of a circuit member according to claim 7,
    wherein an adhesive is interposed between the first main surface and the second main surface in the disposing process.

11. The connecting method of a circuit member according to claim 7,
    wherein the first electrode is a transparent electrode.

12. The connecting method of a circuit member according to claim 7,
    wherein the amount of bismuth contained in the bismuth-indium alloy is from 27% by mass to 68% by mass.

13. The connecting method of a circuit member according to claim 12,
    wherein a melting point of the bismuth-indium alloy is from 72° C. to 109° C.

14. The connecting method of a circuit member according to claim 7, wherein a flux is not interposed between the first electrode and the solder material in the disposing process.

\* \* \* \* \*